United States Patent [19]

Nissen et al.

[11] 4,152,778

[45] May 1, 1979

[54] DIGITAL COMPUTER MEMORY

[75] Inventors: Stanley M. Nissen, Reading; Steven J. Wallach, Framingham, both of Mass.

[73] Assignee: Raytheon Company, Lexington, Mass.

[21] Appl. No.: 728,096

[22] Filed: Sep. 30, 1976

[51] Int. Cl.² ............................................. G11C 17/00
[52] U.S. Cl. ...................................... 365/94; 365/189
[58] Field of Search ................... 340/173 R, 173 AM; 365/94, 96–105, 189

[56] References Cited

U.S. PATENT DOCUMENTS

| | | | |
|---|---|---|---|
| 3,560,940 | 2/1971 | Gaensslen | 340/173 AM |
| 3,644,906 | 2/1972 | Weinberger | 340/173 AM |
| 3,763,480 | 10/1973 | Weimer | 340/173 SM |
| 3,772,658 | 11/1973 | Sarlo | 340/173 SR |
| 3,781,826 | 12/1973 | Beausoleil | 365/200 |
| 3,863,232 | 1/1975 | Johnson et al. | 340/173 AM |

Primary Examiner—Terrell W. Fears
Attorney, Agent, or Firm—Richard M. Sharkansky; Joseph D. Pannone

[57] ABSTRACT

A digital computer memory made up of a plurality of read only memory components arranged in a matrix of rows and columns. The outputs of the columns of memory components are connected to a voltage source and load resistors to provide the output terminals of the memory. Sets of digital words having at least a field or portion of a field with bits represented by the same logical state are grouped in such memory so that, when a word in such set is addressed, the bits in such field are produced at the output terminals by the volage source and load resistors. With such arrangement the number of read only memory components required in such memory is reduced.

3 Claims, 4 Drawing Figures

| | DATA CONTROL FIELD | | | | MICROINSTR MEM ADDR CONT FIELD |
|---|---|---|---|---|---|
| | ALUC | I/OS | REGC | BUSC | |
| BITS | 0　　　7 | 8　　11 | 12　　　15 | 16　　32　33　37 | 38　　　　　　　　　　59 |
| LOCATIONS | | | | | |
| 0 | | | | | |
| (1001)₁₀ | | 1 1 1 1 | | | |
| (1022)₁₀ | | | 1 1 1 1 | | |
| (2050)₁₀ | | | 1 1 1 1 | | |
| (3070)₁₀ | 1 1 1 1 1 1 1 1 | | | | |
| (4095)₁₀ | 1 1 1 1 1 1 1 1 | 1 1 1 1 | | | |

FIG. 2

DIGITAL COMPUTER MEMORY

The invention herein described was made in the course of or under a contract or subcontract thereunder, with the Department of Defense.

BACKGROUND OF THE INVENTION

This invention relates generally to digital computer memories and more particularly to digital computer memories which are made up of a plurality of data storage components.

As is known in the art, microprogram controlled digital computers generally include a microinstruction memory for storing a plurality of microinstructions. Each stored microinstruction generally includes a plurality of fields, each field corresponding to one or more bits in the stored microinstruction. Each bit is represented by one of two logical states. If there are N bits in each microinstruction and if M microinstructions are to be stored in a microinstruction memory, or NxM microinstruction memory has heretofore been designed. Further, it is known that generally many stored microinstructions have a particular field, or portion thereof, which includes a plurality of bits, each being represented by the same logical state.

The microinstruction memory is generally of the "read only" type. Since read only memory (or data storage) components readily available in the marketplace are generally limited to a maximum of 1024 or 2048 addressable words (or locations), each eight bits in length, and many microprogram controlled digital computers require microinstructions which are greater than eight bits in length and more than 2048 addressable words or microinstructions, a plurality of read only memory or data storage components is required to provide the requisite microinstruction storage capacity. Because the cost of each one of the read only memory components adds to the overall cost of the computer, it is desirable to minimize the number of read only memory components required in such computer.

SUMMARY OF THE INVENTION

In accordance with the present invention a digital computer memory includes a set of address terminals, a set of data output terminals and a plurality of data storage components arranged in a matrix of rows and columns, each one of such data storage components having a predetermined number of addressable locations and a predetermined number of bits of storage in each one of such locations, the data storage components in each one of the rows being coupled to the address terminals and the storage elements in such columns being coupled to the data output terminals, the number of bits of storage in predetermined ones of such rows of the memory being less than the number of data output terminals.

With such an arrangement those fields, or portions thereof, which are represented by the same logical state, in particular ones of the microinstructions stored in the memory, are not stored in the data storage components, thereby reducing the number of data storage components used in such memory.

BRIEF DESCRIPTION OF THE DRAWINGS

The above-identified and other features of the invention will become more apparent by reference to the following description taken together in conjunction with the accompanying drawings in which:

FIG. 2 is a diagram useful in understanding the organization of the microinstruction memory used in the digital computer shown in FIG. 1;

DESCRIPTION OF THE PREFERRED EMBODIMENT

Figure 1:
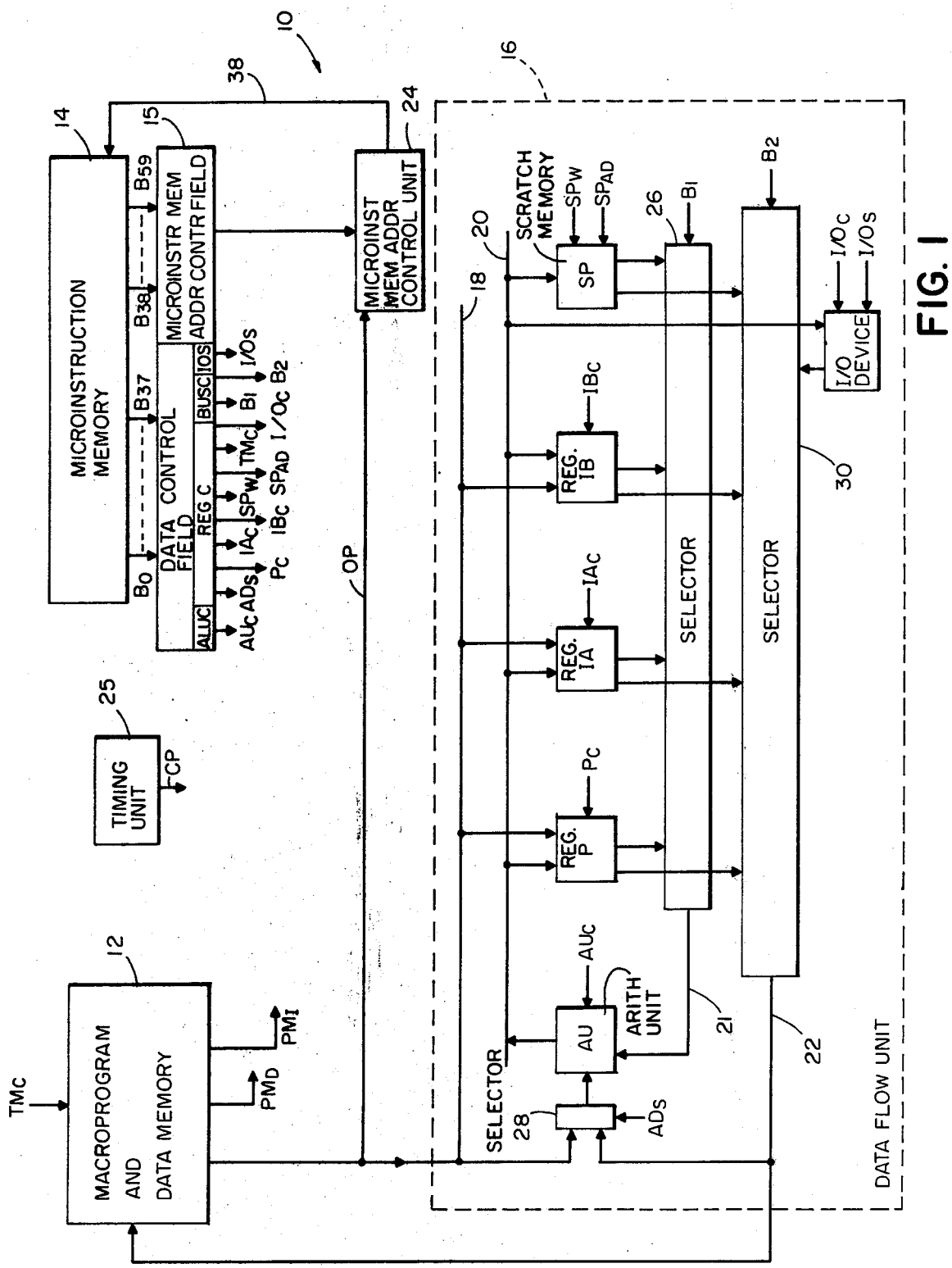
FIG. 1 is a block diagram, somewhat simplified, of a digital computer using a microinstruction memory according to the invention.

Referring now to FIG. 1, a microprogram controlled digital computer 10 is shown to include a macroprogram and data memory 12, here any conventional random access memory, adapted to store a repertoire of macroinstructions, a microinstruction memory 14, here of the "read only" memory type, the details of which will be described in connection with FIG. 3, adapted to store sets of microinstructions, each one of such stored macroinstructions corresponding to a set of stored microinstructions, a register 15 for storing a selected one of such microinstructions, such selected one being the microinstruction under execution by the digital computer 10, a data flow unit 16, here including two input buses 18, 20, two output buses 21, 22, a plurality of registers P, IA and IB, a scratch pad random access memory, SP, and an input/output (I/O) device and an arithmetic unit AU, all of conventional design, and a microinstruction memory address control unit 24, which may be of any conventional design, such as, for example, a control unit similar to the microinstruction memory address control unit described in our copending patent application Ser. No. 662,303, filed Mar. 1, 1976 and assigned to the same assignee as the present invention, and a conventional timing unit 25.

As described in our copending patent application referred to above, the execution of each one of the macroinstructions is accomplished by the execution of each one of the microinstructions in the corresponding set thereof, such execution providing control signals to the data flow unit 16 thereby to control the flow of data in such unit 16 in accordance with each one of the microinstructions. Each one of the microinstructions includes a data flow control field for controlling the flow of data through the arithmetic unit, AU, the registers P, IA and IB, the scratch pad memory SP via input buses 18, 20, output buses 21, 22 and I/O device, while also controlling the function the arithmetic unit AU is to perform on selected data. In addition to such data flow control field each one of such microinstructions includes a microinstruction memory address control field which is fed to the microinstruction memory address control unit 24 for selecting the address of the next microinstruction as described in our above-mentioned copending patent application. After completion of a set of microinstructions which correspond to a selected macroinstruction a new macroinstruction is "fetched" and the operation code thereof is coupled via bus OP to the microinstruction address control unit 24 to provide the address of the first microinstruction in the set thereof which corresponds to the "fetched" macroinstruction.

The data control field may be considered as here being made up of the following fields:

| | |
|---|---|
| ALUC | an eight bit field used to select the function of the arithmetic unit AU; |
| I/OS | a four bit field used to couple a selected one of a plurality of peripheral devices (not shown) of the input/output device to the computer for processing; |
| BUSC | a five bit field used to couple data to buses 21, 22; |
| REGC | a twenty-one bit field used to control the flow of data on buses 18, 20, the read, write and addressing of the scratch pad register SP, and the read/write operation of the macroprogram and data memory 12. |

In particular, the data flow control field of the microinstruction provides binary signals on buses $AU_C$, $AD_S$, $P_C$, $IA_C$, $IB_C$, $SP_W$, $SP_{AD}$, $TM_C$, $I/O_C$, $B_1$, $B_2$, $I/O_S$. It is noted that while each one of such buses is indicated as a single line, such buses are adapted to carry a plurality of bits, each bit represented by one of two logical states. For example, the $AU_C$ bus is an eight bit bus which couples the data in the ALUC field to the arithmetic unit, thereby to select the arithmetic or logic function to be performed on the two digital words supplied to such arithmetic unit AU. One of such data words is coupled to the arithmetic unit AU via output bus 21 from a selector 26. The other one of such data words is coupled to the arithmetic unit AU via selector 28 from either the macroprogram and data memory 12 or bus 22.

The signals in buses $AD_S$, $P_C$, $IA_C$, $IB_C$, $SP_W$, $SP_{AD}$ and $TM_C$ and $I/O_C$ are developed in response to the digital word in the REGC field of the microinstruction stored in the register 15. The buses $P_C$, $IA_C$ and $IB_C$ each carry three bit signals to the registers P, IA and IB, respectively, to control the function of such registers. It should be noted that the P register here serves as a program counter and the IA and IB registers are here general purpose registers. In response to the three bit signals supplied to the register P and register IA, such registers respectively either accept and store data on the bus 18, accept and store data on bus 20; accept, shift right and store data on the bus 18, accept, shift right and store data on bus 20; maintain its present state; or increment the data stored in such registers. In response to the three bit signal supplied to register IB, such register either accepts and stores data from the bus 18; accepts and stores data from bus 20; accepts, shifts right and stores data on bus 18; accepts, shifts right and stores data on bus 20; shifts stored data to the right; stores a logical 0; maintains its present state; or shifts data left. The bus $AD_S$ provides a 1 bit control to selector 28 to selectively couple either the data on bus 18 or the data on bus 22 to the arithmetic unit AU. The bus $SP_W$ provides a 1 bit control signal to the scratch pad memory SP to place such memory in either a read mode or a write mode, thereby to enable data on input bus 20 to be stored in such scratch pad memory at the location specified by an eight bit word on bus $SP_{AD}$. The bus $TM_C$ provides a 1 control signal to the macroprogram and data memory 12 in either a read or write mode, the address of such memory being supplied by the data on bus 22. The bus $I/O_C$ provides a 1 bit signal to the I/O device to enable such device to accept data from input bus 20.

The signals on buses $B_1$ and $B_2$ are developed in response to the BUSC field of the microinstruction stored in register 15. Bus $B_1$ carries a 2 word to selector 26 to selectively couple to output bus 21 either a word stored in the register P, a word stored in register IA, a word stored in register IB or a word stored in the scratch pad memory SP (such stored word being at a location specified by the data on bus $SP_{AD}$). Bus $B_2$ carries a three bit binary signal to selector 30 to couple to output bus 22 selectively either the digital word stored in the register P, the digital word stored in the register IA, the digital word stored in register IB, the digital word of the peripheral devices in the I/O device as selected by the signal on bus $I/O_S$ or the digital word stored in the scratch memory SP, such word being stored therein at the location specified by the data on bus $SP_{AD}$.

The signals on bus $I/O_S$ are developed in response to the digital word in the I/OS field of the microinstruction stored in register 15. Such signal is here a four bit signal used to couple a selected one of a plurality of, here 16, peripheral devices (not shown) to the selector 30. The selected peripheral may be then coupled to bus 22 in response to a signal on bus $B_2$.

In a typical operation of the digital computer 10 many of the microinstructions have a field, or portion thereof, which includes a plurality of bits represented by the same logical state. For example, a particular set of microinstructions may not use the I/OS field because during execution of such set data from peripheral devices are not being fed to the bus 22. Therefore, such microinstructions will have, here, logical 1's for all bits in the I/OS field. Likewise, when data is being fed from a selected peripheral device to the data memory in response to certain microinstructions the ALUC field is not used. Therefore, such microinstructions will have, here, all logical 1's for all of the bits in the ALUC field. Still further, certain microinstructions require use of only a portion of a field. For example, the portion of the REGC field which develops signals on buses $I_A$ and $SP_W$ may not be used in a particular set of microinstructions. Therefore, such microinstructions will have, here, logical 1's for all bits in such portion of the REGC field. The microinstruction memory 14 is made up of a plurality of data storage components, here read only memory (ROM) components. As will be shown hereinafter, the number of ROM components required to make up the microinstruction memory 14 is minimized by grouping together microinstructions which have a particular field, or portion thereof, which is made up of bits represented by the same logical state. In the example the microinstruction memory 14 is adapted to store 4096 microinstructions. Each microinstruction includes a 38 bit data control field (made up an 8 bit ALUC field, a 5 bit BUSC field, a 4 bit I/OS field and a 21 bit REGC field) and a microinstruction memory address control field, here 22 bits, to form a 60 bit microinstruction. As is known, such microinstruction memory 14 may be implemented using 60 ROM data storage components, each ROM data storage component being adapted to store 1024 words, each word having 4 bits. The arrangement of microinstructions in the microinstruction memory 14 is as represented in FIG. 2. In the example, for each microinstruction, bits 0–7 represent the ALUC field, bits 8–11 represent the I/OS field, bits 12–32 represent the REGC field, bits 33–37 represent the REGC field, and bits 38–59 represent the microinstruction memory address control field. It should be noted that bits 12–15 of an addressed microinstruction stored in register 15 develop the signals on bus $IA_C$ and bus $SP_W$. Further, in the example, the microinstructions in locations $(1001)_{10}$ through $(4095)_{10}$ have logical 1's for all bits in the I/OS field because the peripheral devices are not fed to bus 22 during execution of the microinstructions in such locations. Further, in the example, the microinstructions in locations $(1022)_{10}$ through $(2050)_{10}$ have logical 1's for all bits in the REGC field which develops signals on bus $IA_C$ and bus $SP_W$ (i.e., bits 12-15). Still further, in the example, the microinstructions in locations $(3070)_{10}$ through $(4095)_{10}$ have logical 1's for all bits in the ALUC field because a selected peripheral device is being fed to the macroprogram memory from bus 22 during execution of the macroinstructions in such locations.

Figure 3:
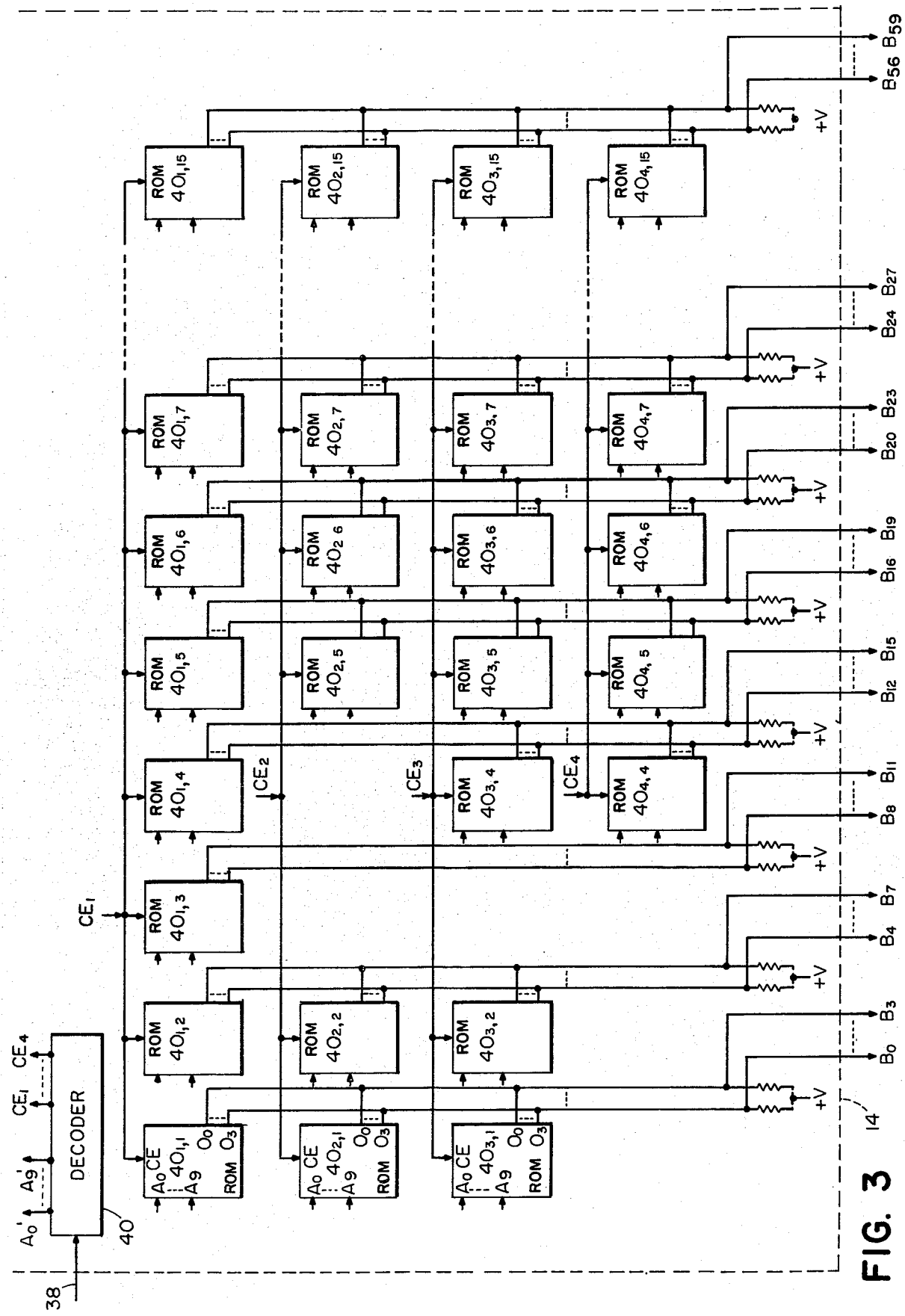
FIG. 3 is a block diagram of the microinstruction memory used in the computer shown in FIG. 1.
Figure 4:
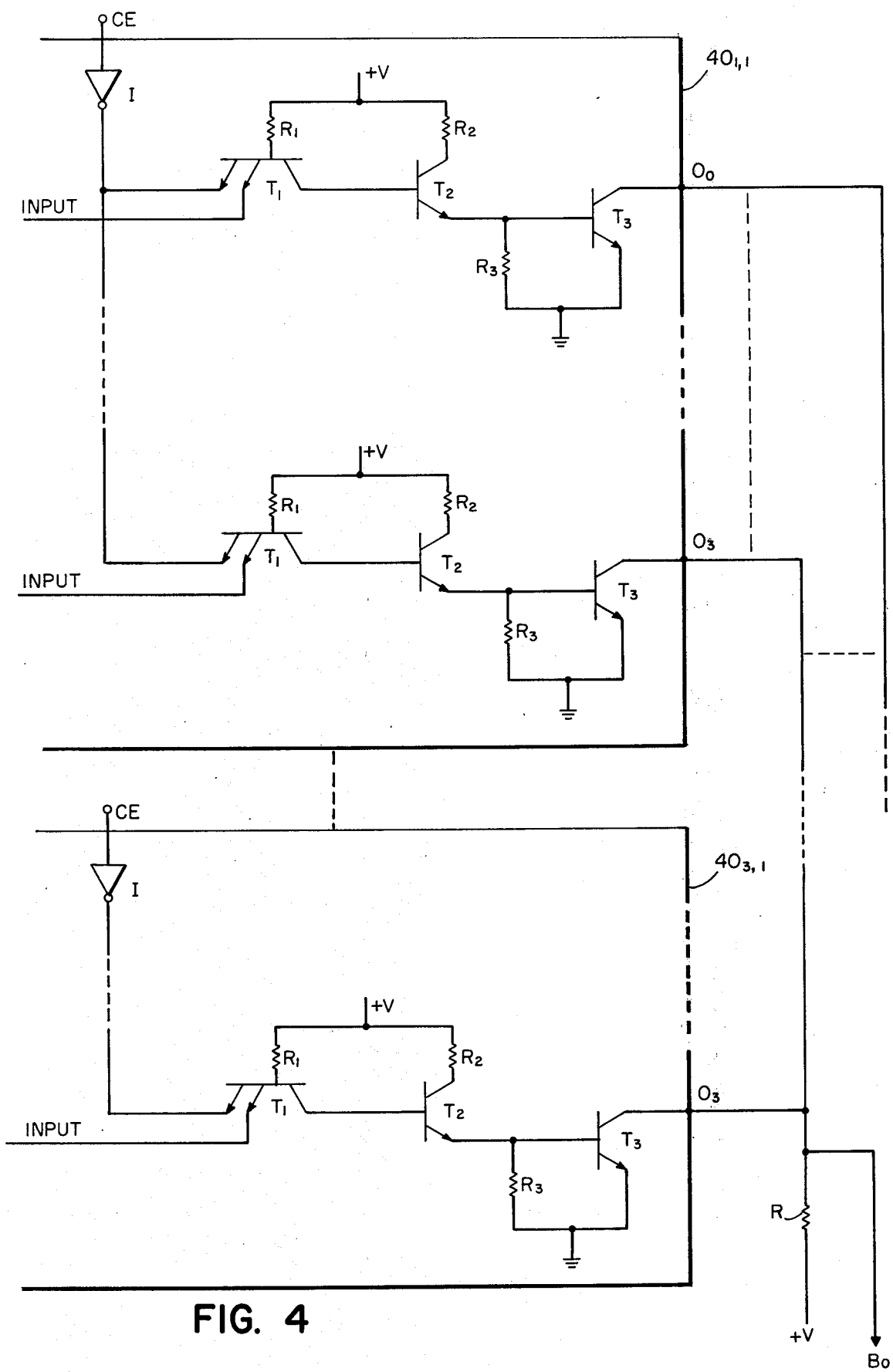
FIG. 4 is a schematic diagram showing open collector output gates of one terminal of a column of data storage components in a wired -OR configuration to form an output terminal of the microinstruction memory used in the digital computer shown in FIG. 1.

Referring now to FIG. 3, microinstruction memory 14 is shown to include a decoder 40, here of any conventional design. Such decoder 40 is fed by bus 38. Such microinstruction memory 14 also includes a plurality of data storage components, $40_{m,n}$, arranged in a matrix of rows and columns, the subscript m designating the row of such components and the subscript n designating the column of such component. Each one of such data storage components $40_{m,n}$ is a TTL, open collector output, read only memory component, here a Model A 6350 manufactured by Monolithic Memories, Inc.. Each one of the data storage components $40_{m,n}$ is adapted to store 1024 digital words, each word having 4 bits. Each data storage component includes 10 address terminals $A_0$—$A_9$, a chip enable terminal CE, and four output terminals $0_0$-$0_3$, as shown, for an exemplary one of such data storage components, here data storage component $40_{1,1}$. The 10 data address terminals $A_0$-$A_9$ are connected to 10 address outputs $A'_0$-$A'_9$ of the decoder 40. Four chip enable lines $CE_1$-$CE_4$ are coupled between the decoder 40 and the chip enable terminals CE of the data storage components $40_{m,n}$. As shown, the chip enable line $CE_1$ is connected to the chip enable terminals CE of the data storage components in the first row (i.e., data storage components $40_{1,1}$-$40_{1,15}$). Chip enable line $CE_2$ is connected to the data storage components in the second row (i.e., data storage components $40_{2,1}$-$40_{2,2}$ and $40_{2,5}$-$40_{2,15}$). Chip enable line $CE_3$ is connected to the data storage components in the third row (i.e., components $40_{3,1}$-$40_{3,2}$ and $40_{3,4}$-$40_{3,15}$). Chip enable line $CE_4$ is connected to the data storage components in the fourth row (i.e., components $40_{4,4}$-$40_{4,15}$). The data storage components in each column are wired —OR to a +V voltage supply through a conventional pull-up or load resistor, not numbered, in a conventional manner, as described in the book entitled "Designing With TTL Integrated Circuits," edited by R. L. Morris and J. R. Miller, published by McGraw Hill Book Company, New York, N.Y., 1971, pg. 46 and pgs. 127-128. That is, referring also to FIG. 4, exemplary ones of the output terminals of an exemplary one of the columns of data storage components, here output terminal $0_3$ of the data storage components in the first column (i.e., components $40_{1,1}$, $40_{2,1}$, $40_{3,1}$) are shown connected to open collector output gates. As shown, each open collector output gate includes a coupling transistor $T_1$ having one emitter electrode coupled to the chip enable terminal, CE, of such component through an inverter, I, the chip enable terminals CE of components $40_{1,1}$-$40_{3,1}$ being coupled to chip enable lines $CE_1$-$CE_3$, respectively, as discussed above. The second emitter electrode of transistor $T_1$ is coupled to an INPUT line, such line being coupled to the "memory" element (not shown) of the ROM data storage component in any conventional manner. The base electrode of transistor $T_1$ is connected to a +V voltage supply through a resistor $R_1$ and the collector electrode of such transistor $T_1$ is connected to the base electrode of transistor $T_2$. The collector electrode of transistor $T_2$ is connected to the +V voltage supply through a resistor $R_2$ and the emitter electrode of transistor $T_2$ is connected to: (a) ground through a resistor $R_3$, and (b) the base electrode of transistor $T_3$. The emitter electrode of transistor $R_3$ is connected to ground and the collector electrode is connected to the output terminal $0_3$.

In operation, to enable a data storage component the chip enable terminal CE of such component is fed with a "low" signal and to disable such component such terminal CE is fed with a "high" signal. It is noted that when the chip enable terminal CE is "low," transistor $T_1$ is controlled by the signal on the INPUT line and when the chip enable terminal CE is "high," transistor $T_1$ goes "on" and transistors $T_2$ and $T_3$ go "off," thereby providing an open circuited output to terminal $0_3$. Considering the case when the chip enable line $CE_1$ is "low" (i.e., component $40_{1,1}$ is enabled) and therefore lines $CE_2$-$CE_4$ are "high" (i.e., components $40_{2,1}$-$40_{3,1}$ are "open circuited" as discussed above), if the INPUT line of component $40_{1,1}$ is "low" (i.e., logical 0), transistor $T_1$ turns "on" and the base electrode of transistor $T_2$ goes "low," turning transistor $T_2$ "off," thereby turning transistor $T_3$ "off," causing terminal $0_3$ (and hence $B_3$) to be an "open circuit." Therefore, the "high" +V voltage souce appears at terminal $B_0$ and therefore such terminal $B_0$ produces a logical 1 signal. If the INPUT line of component $40_{1,1}$ is "high" (logical 1), transistor $T_1$ goes "off," transistors $T_2$ and $T_3$ turn "on" and hence a logical 0 is produced at terminal $0_3$ and hence at terminal $B_0$. It is noted that any one of the output terminals $0_3$ in the column of components will produce a logical 1 if, and only if, the output signals of all output terminals $0_3$ in such column are logical 1's and the resulting output signal at terminal $B_0$ is then a logical 1. As soon as one of the output terminals $0_3$ in the column becomes a logical 0 the output terminal $B_0$ becomes a logical 0. That is, considering, for example, the first column of data storage components (i.e., components $40_{1,1}$-$40_{3,1}$) the output terminals $0_0$-$0_3$ of each one of such components are wired —OR to the +V voltage supply through pull-up or load resistors, not numbered, to form memory output terminals $B_0$-$B_3$, respectively. Likewise, the output terminals $0_0$-$0_3$ of each one of the data storage components in the second column (i.e., data storage components $40_{1,2}$-$40_{3,2}$) are wired —OR to four memory output terminals $B_4$-$B_7$. Continuing from column to column, the memory output terminals $B_8$-$B_{59}$ are likewise found. The output terminals $B_0$-$B_{59}$, therefore, provide the output terminals for microinstruction memory 14 and the 60 bit microinstruction read from such memory appears on such output terminals $B_0$-$B_{59}$ and is fed to register 15 (FIG. 1). As described above and and also in the referenced book, because the data storage components in each column are wired —OR, any one of the output terminals $B_0$-$B_{59}$ will produce a logical 1, if, and only if, the output signals of all open collector output data storage component outputs coupled to such one of the terminals are logical 1's and the resulting output signal on such one of the output terminals becomes a logical 1. As soon as one of the output signals coupled to such one of the output terminals becomes a logical 0, such output terminal produces a logical 0. Therefore, considering an exemplary one of the memory output terminals, say memory output terminal $B_0$, such terminal $B_0$ produces a logical 1 unless the outputs $0_0$ of data storage components $40_{1,1}$ and/or data storage component $40_{2,1}$ and/or data storage component $40_{3,1}$ is a logical 0.

Considering now the microinstruction memory 14, in operation, when the chip enable line $CE_1$ is enabled a microinstruction in one of the locations 0 through $(1023)_{10}$ is addressed, the specific one of such locations being selected in accordance with the ten bit address signal applied to address terminals $A_0$-$A_9$. Likewise, chip enable lines $CE_2$ through $CE_4$ are adapted to enable microinstructions in locations $(1024)_{10}$ through $(2047)_{10}$, $(2048)_{10}$ through $(3071)_{10}$ and $(3072)_{10}$ through $(4095)_{10}$, respectively, to be addressed, the specific microinstruction in such selected row of data storage components being selected in accordance with the 10 bit address signal on terminals $A_0$-$A_9$. The selected or addressed microinstruction appears as a set of binary signals on the memory output terminals $B_0$-$B_{59}$, the binary signals on such terminals $B_0$-$B_{59}$ representing bits 0-59 respectively, of the addressed microinstruction. It should be noted that, because the data storage components in each column are wired —OR as described above, if a microinstruction in locations $(3072)_{10}$ through $(4095)_{10}$ is addressed, the data storage components in the first and second columns will produce logical 1's at the output terminals thereof because such terminals have open collector outputs and such data storage components are not enabled by the lines $CE_1$-$CE_3$ and therefore logical 1's are produced at memory output terminals $B_0$-$B_7$. Similarly, when a microinstruction in locations $(1024)_{10}$-$(4095)_{10}$ is addressed, memory output terminals $B_8$-$B_{11}$ produce logical 1's because open collector output data storage component $40_{1,3}$ is not enabled. Likewise, when a microinstruction in locations $(1024)_{10}$ through $(2047)_{10}$ is addressed, terminals $B_{12}$-$B_{15}$ produce logical 1's because open collector output data storage components $40_{1,4}$ and $40_{3,4}$-$40_{4,4}$ are not enabled. It should now be noted that instead of requiring $15 \times 4$ or 60 data storage components to implement the microinstruction memory 14, here only 54 data storage components are required in the example because of the grouping together of microinstructions in the memory 14 which have common unused fields. More specifically, in the example (and referring also to FIG. 2), the microinstructions which have logical 1's for all bits in the ALUC field are grouped together so as to include locations $(3072)_{10}$ through $(4095)_{10}$ and therefore logical 1's are developed at terminals $B_0$-$B_7$ when the microinstruction in such locations are addressed without requiring data storage components in row 4, columns 1 and 2, to store the ALUC field in such locations. The logical 1's, are developed at terminals $B_0$-$B_7$ by the wired —OR open collector output data storage components $40_{1,1}$-$40_{3,1}$ and data storage components $40_{1,2}$-$40_{3,2}$, respectively. Therefore, data storage components are not required in column 1, row 4 or column 2, row 4 of the memory 14. Likewise, the microinstructions which have logical 1's for all bits in the I/OC field are grouped to include locations $(1024)_{10}$ through $(4095)_{10}$. When a microinstruction in such locations is addressed, the date storage component $40_{1,3}$ develops logical 1's at memory output terminals $B_8$-$B_{11}$, eliminating the requirement for data storage components in column 3, rows 2 through 4 of the memory 14. Likewise, the microinstructions which have logical 1's for all bits in the portion of the REGC field unused are grouped together to include locations $(1024)_{10}$ through $(2047)_{10}$. When a microinstruction in such locations in addressed, the wired -OR data storage components $40_{1,4}$, $40_{3,4}$, $40_{4,4}$ develop logical 1's at terminals $B_{12}$-$B_{15}$, eliminating a data storage component in column 4, row 2.

To put it another way, a data storage component having an open collector output can produce either: (a) an open circuit to the $+V$ voltage supply and load resistor, in which case the $+V$ voltage source produces a logical 1 signal; or (b) a "ground" for the $+V$ voltage source and load resistor, in which case a logical 0 is produced. Therefore, considering the example, the logical 1's produced at output terminals $B_0$-$B_7$ when the microinstructions in locations $(3072)_{10}$ through $(4095)_{10}$ are addressed lines $CE_1$-$CE_3$ are "high" and chip enable line $CE_4$ is "low" (i.e., dispensable) are produced by the $+V$ voltage source and load resistors coupled to such terminals because the then disabled open collector components $40_{1,1}$, $40_{2,1}$, $40_{3,1}$ provide an open circuit to such load resistor and $+V$ voltage source. Likewise, when the microinstructions in locations $(1024)_{10}$ through $(4095)_{10}$ are addressed the logical 1's at terminals $B_8$-$B_{11}$ are produced by the $+V$ voltage source and the load resistors connected to such terminals, because of the open circuit provided by the disabled component $40_{1,3}$; and, when the microinstructions in locations $(1024)_{10}$ through $(2047)_{10}$ are addressed logical 1's at terminals $B_{12}$-$B_{15}$ are produced by the $+V$ voltage source and the load resistors connected to such terminals because of the open circuit provided by the disabled components $40_{1,4}$, $40_{3,4}$ and $40_{4,4}$.

Having described a preferred embodiment of this invention, it is now evident that other embodiments incorporating its concepts may be used. For example, tri-state output data storage components may be used because when not enabled such components provide an open circuit to the $+V$ voltage source and load resistor. With such arrangement those columns which include a data storage component in each row thereof need not include a load resistor because such tri-state output data storage component is adapted to produce a logical 1, a logical 0 or an "off" (or open circuit) output. Still further, data storage components adapted to store other than 1024 digital words may be used. Likewise, such data storage components need not be limited to storage of words having four bits. It is felt, therefore, that this invention should not be restricted to the preferred embodiment, but rather should be limited only by the spirit and scope of the appended claims.

What is claimed is:

1. A digital computer memory comprising:
  (a) a plurality of data storage components arranged in a matrix of rows and columns, each one of such components comprising:
    (i) a set of address terminals;
    (ii) a plurality of bits of storage at each one of a plurality of locations;
    (iii) a set of component output terminals; and,
    (iv) a set of gates, each component output terminal in such set being fed by one of such gates, such gate being responsive to component enable/disable signals, for allowing a voltage source to produce a logical signal at such output terminal in response to the disable signal and for coupling to such output terminal in response to the enable signal a corresponding one of the stored bits in the location addressed by data applied to the set of address terminals producing a logical signal at such output terminal in accordance with the stored bit;

(b) means for coupling the component output terminals of the columns of data storage components to a corresponding one of a plurality of memory output terminals; and (c) wherein the number of data storage components in one row thereof is different from the number of data storage components in another row thereof.

2. The digital computer memory recited in claim 1 wherein the data storage components are memory components.

3. The digital computer memory recited in claim 2 wherein the component output terminals in the columns of data storage components are wired -OR to output terminals of the memory.

* * * * *